United States Patent
Petrofsky

(10) Patent No.: US 7,265,591 B1
(45) Date of Patent: Sep. 4, 2007

(54) CMOS DRIVER WITH MINIMUM SHOOT-THROUGH CURRENT

(75) Inventor: Joseph G. Petrofsky, Los Gatos, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/304,820

(22) Filed: Dec. 16, 2005

Related U.S. Application Data

(62) Division of application No. 10/891,108, filed on Jul. 15, 2004.

(51) Int. Cl.
*H03K 3/00* (2006.01)

(52) U.S. Cl. .................. 327/108; 327/109; 327/110; 327/111; 327/112; 327/376; 326/82; 326/83; 326/84; 326/86

(58) Field of Classification Search .............. 327/108
See application file for complete search history.

(56) References Cited

U.S. PATENT DOCUMENTS

| | | | |
|---|---|---|---|
| 5,138,194 A * | 8/1992 | Yoeli ........................ 326/33 |
| 5,408,150 A   | 4/1995 | Wilcox ...................... 327/108 |
| 5,430,404 A * | 7/1995 | Campbell et al. ........... 327/566 |
| 5,514,995 A * | 5/1996 | Hennig ....................... 327/399 |
| 5,541,541 A * | 7/1996 | Salamina et al. ........... 327/108 |
| 5,546,033 A * | 8/1996 | Campbell et al. ........... 327/170 |
| 5,656,970 A * | 8/1997 | Campbell et al. ........... 327/565 |
| 5,877,635 A * | 3/1999 | Lin ............................ 326/83 |
| 5,929,656 A * | 7/1999 | Pagones ..................... 326/83 |
| 6,448,383 B2* | 9/2002 | Yamanaka et al. .......... 534/557 |
| 6,580,322 B2* | 6/2003 | Miao et al. ............. 330/207 A |
| 6,653,878 B2* | 11/2003 | Nolan ........................ 327/170 |

\* cited by examiner

*Primary Examiner*—Tuan T. Lam
*Assistant Examiner*—Hiep Nguyen
(74) *Attorney, Agent, or Firm*—McDermott Will & Emery LLP

(57) ABSTRACT

A CMOS driver with minimum shoot-through current is disclosed. The potential for shoot-through current may be eliminated or reduced with a break-before-make circuit driving an output stage. The break-before-make circuit may include a first logic element followed by a first inverter and a second logic element followed by a second inverter. The inverters may be cross-coupled to one another and/or the internal transistors may be configured with different strengths. The logic elements may be configured to eliminate or reduce potential shoot-through current paths, and the signal inputs may be controlled within a certain voltage range.

9 Claims, 3 Drawing Sheets

CMOS DRIVER WITH MINIMUM SHOOT-THROUGH CURRENT

RELATED APPLICATION

This application is a divisional of U.S. application Ser. No. 10/891,108, filed Jul. 15, 2004.

BACKGROUND

1. Field

The present disclosure relates generally to electronic circuits, and more specifically, to CMOS drivers.

2. Background

Complimentary metal-oxide-semiconductor field-effect transistor (CMOS) drivers are commonly used today in a wide variety of electronic applications. A CMOS driver is well known in the art and generally includes a p-channel metal-oxide-semiconductor field-effect transistor (PMOS transistor) connected in series with an n-channel metal-oxide-semiconductor field-effect transistor (NMOS transistor). The source of the PMOS transistor may be coupled to a power supply, and the source of the NMOS transistor may be coupled to the power supply return. The drains of the two transistors may be coupled together and the output taken from the common drain. The gates of the two transistors may also be tied together and driven rail-to-rail.

Various challenges exist in the design of CMOS drivers. By way of example, CMOS drivers may experience shoot-through current during output transitions, resulting in increased power consumption. "Shoot-through current" is an undesirable effect which may result if both the PMOS and NMOS transistors are on at the same time. To reduce shoot-through current, some CMOS drivers may include a break-before-make circuit. The break-before-make circuit may be used to control the gate inputs to the CMOS driver individually so that the currently driven transistor is turned OFF (break) before the other transistor is turned ON (make). Unfortunately, the break-before-make circuit may compromise the speed of the CMOS driver. Moreover, the break-before-make circuit may itself experience shoot-through current.

Accordingly, there is a need in the art for a high speed CMOS driver with low power consumption. This may be achieved with circuitry designed to minimize the potential for shoot-through current without significantly slowing down the operation of the CMOS driver.

SUMMARY

In one aspect of the present invention, a break-before-make circuit includes a first logic element having an enabled state and a disabled state, the first logic element further having an output, and being configured to invert a signal input and provide the inverted signal input to its output in the enabled state, the first logic element further being configured to float its output in the disabled state if the signal input is in a first logic state. The break-before-make circuit further includes a second logic element having an enabled state and a disabled state, the second logic element further having an output, and being configured to invert a signal input and provide the inverted signal input to its output in the enabled state, the second logic element further being configured to float its output in the disabled state if the signal input is in a second logic state, the second logic state having a voltage higher than the first logic state. The break-before-make circuit also includes a first inverter having an input coupled to the output of the first logic element, and an output, the state of the second logic element being responsive to the first inverter output, and a second inverter having an input coupled to the output of the second logic element, and an output, the state of the first logic element being responsive to the second inverter output.

In another aspect of the present invention, a break-before-make circuit includes first and second inverters each having an input and output. The break-before-make circuit further includes a first logic element comprising a first PMOS transistor configured to be coupled to a power supply, a first NMOS transistor configured to be coupled to a power supply return, and a second PMOS transistor coupled between the first PMOS transistor and the first NMOS transistor, the first PMOS transistor and the first NMOS transistor being configured to receive a signal input, the second inverter output being coupled to the second PMOS transistor, and the input to the first inverter being taken between the second PMOS transistor and the first NMOS transistor, and wherein the first logic element does not include a NMOS transistor which is coupled in parallel with the first NMOS transistor and controlled by the second inverter output. The break-before-make circuit also includes a second logic element comprising a third PMOS transistor configured to be coupled to the power supply, a second NMOS transistor configured to be coupled to the power supply return, and a third NMOS transistor coupled between the third PMOS transistor and the second NMOS transistor, the third PMOS transistor and the second NMOS transistor being configured to receive the signal input, the first inverter output being coupled to the third NMOS transistor, and the input to the second inverter being taken between the third PMOS transistor and the third NMOS transistor, and wherein the second logic element does not include a PMOS transistor which is coupled in parallel with the third NMOS transistor and controlled by the first inverter output.

In yet another aspect of the present invention, a break-before-make circuit includes first and second logic elements each having an enabled state and a disabled state, each of the first and second logic elements having an output, and being configured to invert a signal input and provide the inverted signal input to its respective output in the enabled state. The break-before-make circuit also includes a first inverter having an input coupled to the output of the first logic element, a power node configured to be coupled to a power supply, a return node, and an output, wherein the state of the second logic element is responsive to the first inverter output, and a second inverter having an input coupled to the output of the second logic element, a power node coupled to the first inverter output, a return node configured to be coupled to a power supply return, and an output coupled to the return node of the first inverter, wherein the state of the first logic element is responsive to the second inverter output.

In a further aspect of the present invention, a circuit includes a CMOS driver including an output stage and break-before-make circuit configured to drive the output stage, the break-before-make circuit having a first input comprising a pair PMOS transistors and a second input comprising a pair of NMOS transistors. The circuit also includes a logic circuit configured to provide first and second logic states within a first voltage range to the first input, and third and fourth logic states within a second voltage range to the second input, the first voltage range being non-overlapping with the second voltage range.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description may include specific details for the purpose of providing a thorough understanding of the present invention. However, it will be apparent to those skilled in the art that the present invention may be practiced without these specific details. In some instances, well-known structures and components may be shown in block diagram form in order to avoid obscuring the concepts of the present invention.

Figure 1:
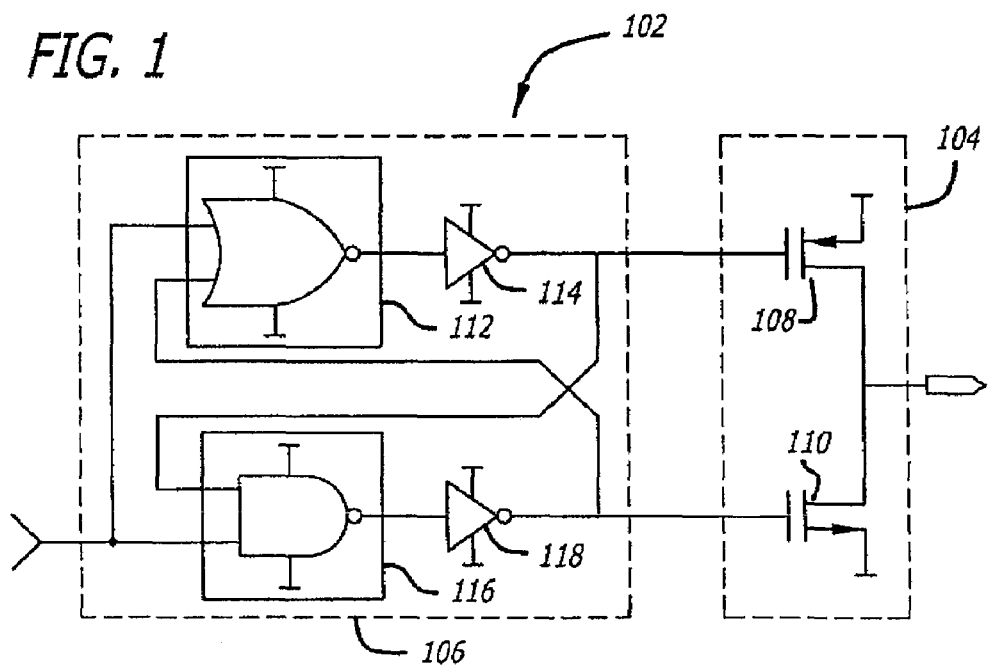
FIG. 1 is a schematic block diagram of a CMOS driver.

FIG. 1 is a schematic block diagram of a CMOS driver. The CMOS driver 102 may include an output driver stage 104 controlled by a break-before-make circuit 106. The output driver stage 104 may include a PMOS transistor 108 having its source coupled to the power supply and an NMOS transistor 110 having its source coupled to the power supply return. The term "coupled" means "connected to" and such connection can either be direct or, where appropriate in the context, can be indirect, e.g., through intervening or intermediary devices or other means. The drains of the two transistors 108 and 110 may be coupled together and the output taken from the common drain. The gate of each transistor 108 and 110 may be controlled individually by the break-before-make circuit 106.

The break-before-make circuit 106 may include a first logic element 112 followed by a first INVERTER 114. The first logic element 112 may be a two-input NOR gate as shown in FIG. 1, or any other suitable logic element. The first INVERTER 114 may be coupled to the gate of the PMOS transistor 108. The break-before-make circuit 106 may also include a second logic element 116 followed by a second INVERTER 118. The second logic element 116 may be a two-input NAND gate as shown in FIG. 1, or any other suitable logic element. The second INVERTER 118 may be coupled to the gate of the NMOS 110 transistor.

The logic elements 112 and 116 and the inverters 114 and 118 are digital devices that operate in a binary manner. In other words, the inputs and outputs can exist only in two quantized or logic states: a high or low. Using the symbols "0" and "1" to represent the two logic states, the following Boolean expression can be written for the NOR gate 112:

$$f(input_1, input_2) = (input_1 + input_2)' \quad (1).$$

Similarly, the following Boolean expression can be written for the NAND gate 116:

$$f(input_1, input_2) = input_1' + input_2' \quad (2).$$

The logic elements 112 and 116 can be thought of as having a common signal input and independent enable inputs. The output of the first INVERTER 114 may be the enable input to the NAND gate 116, and the output of the second INVERTER 118 may be the enable input to the NOR gate 112. When a logic element is enabled, the signal input is passed to the output of its respective inverter. Conversely, when a logic element is disabled, the output of its respective inverter is forced into a fixed logic state regardless of the signal input.

Referring to equation (1), the NOR gate 112 is enabled when its enable input is low and disabled when its enable input is high. When the NOR gate 112 is disabled, the output of its respective INVERTER 114 is high regardless of the signal input. Referring to equation (2), the NAND gate 116 is enabled when its enable input is high and disabled when its enable input is low. When the NAND gate 116 is disabled, the output of its respective INVERTER 118 is low regardless of the signal input.

The enable inputs to the logic gates 112 and 116 may be used to provide a break-before-make driving signal to the output driver stage 104. By way of example, if the signal input to CMOS driver 102 is low, the low level outputs from the INVERTERS 114 and 118 force the PMOS transistor 108 ON and the NMOS transistor 110 OFF in the static state. The low level outputs from the INVERTERS 114 and 118 also enable the NOR gate 112 and disable the NAND gate 116. If a transition occurs in the signal input from a low level signal to a high level signal, the high level signal is passed through the enabled NOR gate 112 and the first INVERTER 114 to the PMOS transistor 108. The high level output from the first INVERTER 114 turns the PMOS transistor 108 OFF, thereby "breaking" the connection between the power supply and the output taken from the common drain of the two transistors 108 and 110. The high level signal input to the disabled NAND gate 116 must wait until the high level output from the first INVERTER 114, which is used to turn OFF the PMOS transistor 108, is applied to the enable input of the NAND gate 116. Once this occurs, the high level signal input is passed through the NAND gate 116 to the NMOS transistor 110 via the second INVERTER 118. The high level output from the second INVERTER 118 turns the NMOS transistor 110ON, thereby "making" a connection between the power supply return and the output taken from the common drain of the two transistors 108 and 110. The high level output from the second INVERTER 118 is also coupled to the enable input of the NOR gate 112 to disable it. With the NOR gate 112 disabled, the PMOS transistor 108 remains OFF regardless of changes in the signal input.

Should the high level signal input to the CMOS driver 102 transition to a low level signal, the low level signal is passed through the enabled NAND gate 116 and the second INVERTER 118 to the NMOS transistor 110. The low level output from the second INVERTER 118 turns the NMOS transistor 110 OFF, thereby "breaking" the connection between the power supply return and the output taken from the common drain of the two transistors 108 and 110. The low level signal input to the disabled NOR gate 112 must wait until the low level output from the second INVERTER 118, which is used to turn OFF the NMOS transistor 110, is applied to the enable input of the NOR gate 112. Once this occurs, the low level signal input to the NOR gate 112 is passed through to the PMOS transistor 108 via the first INVERTER 114. The low level output from the first INVERTER 114 turns the PMOS transistor 108 ON, thereby "making" a connection between the power supply and the output taken from the common drain of the two transistors 108 and 110. The low level output from the first INVERTER 114 is also coupled to the enable input of the NAND gate 116 to disable it. With the NAND gate 116 disabled, the NMOS transistor 110 remains OFF regardless of changes in the signal input.

Figure 2:
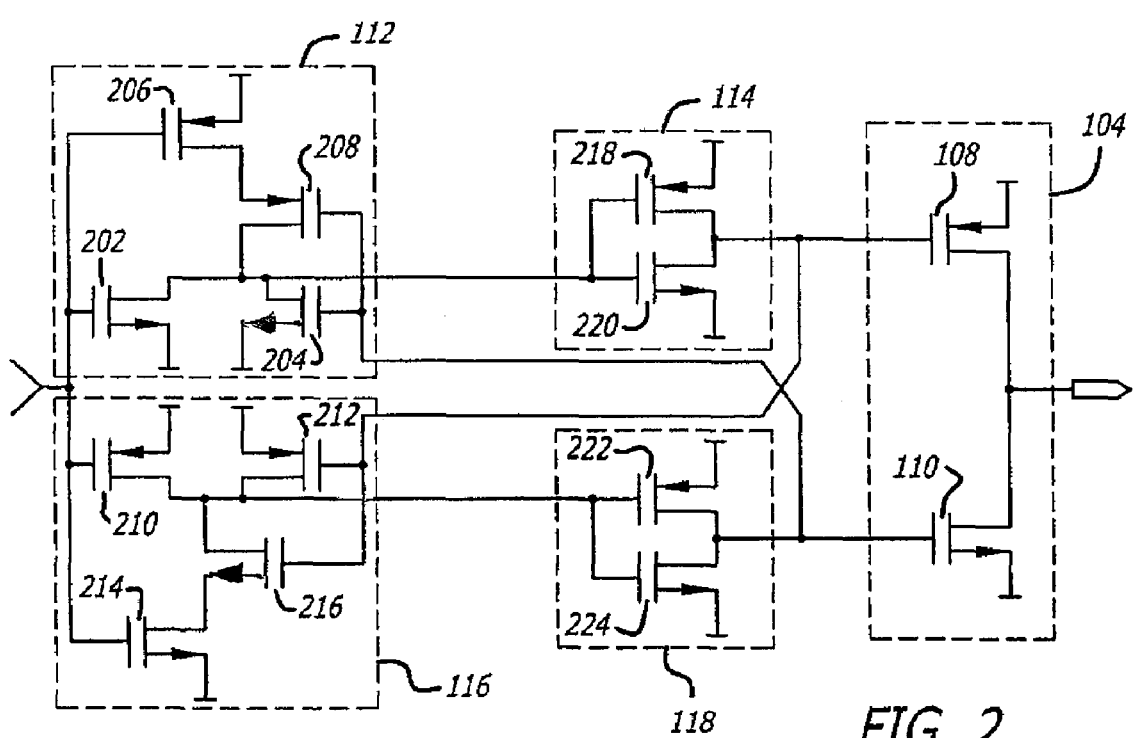
FIG. 2 is a detailed schematic diagram of a CMOS driver.

FIG. 2 is a detailed schematic diagram of the CMOS driver. The NOR gate 112 is shown with two parallel NMOS transistors 202 and 204 with their sources coupled to the power supply return and their drains coupled together, with the output of the NOR gate 112 taken from the common drain. The NOR gate 112 may also include two series PMOS transistors 206 and 208 coupled between the power supply and the output of the NOR gate 112. The signal input may be coupled to the gates of the NMOS and PMOS transistors 202 and 206, and the enable input may be coupled to the gates of the NMOS and PMOS transistors 204 and 208.

In one embodiment of the CMOS driver 102, the NMOS transistor 204 coupled to the enable input may be eliminated to reduce the potential for shoot-through current. By inspection, one skilled in the art can readily see that the NMOS transistor 204 is only required when its gate drive is high, while at the same time the gate drive to the NMOS transistor 202 is low. Otherwise, the NMOS transistor 204 is not needed. However, as explained in greater detail in connection with FIG. 1, the signal input to the NOR gate 112 is cross-coupled to the enable input through the NAND gate 116 and the second INVERTER 118 in the static condition. Accordingly, on a static basis, there is no way for the gate of the NMOS transistor 202 to be low while the gate of the NMOS transistor 204 is high. And on a dynamic basis, the only time when that will happen is when the signal input to the CMOS driver 102 is making a transition from a high level signal to a low level signal. At that transition, the output of the NOR gate 112 is held low by the NMOS transistor 204 until the low level input signal has propagated through the NAND gate 116 and the second INVERTER 118. Only then will the output of the NOR gate 112 rise to a high level. However, in the absence of the NMOS transistor 204, the output of the NOR gate 112 will not rise simply because the signal input to the CMOS driver 102 has fallen to a low level signal. The high level signal on the gate of the PMOS transistor 208 will prevent the PMOS transistor 206 from pulling up the floating output of the NOR gate 112 until the output of the second INVERTER 118 drops to a low level signal. Thus, the NMOS transistor 204 may be omitted, which not only reduces the complexity of the break-before-make circuit 106, but eliminates a potential shoot-through current path through transistors 206, 208 and 204. The term "floating" refers to a signal that is disconnected from both the power supply and the power supply return.

The NAND gate 116 is shown with two parallel PMOS transistors 210 and 212 with their sources coupled to the power supply and their drains coupled together, with the output of the NAND gate 116 taken from the common drain. The NAND gate 116 also includes two series NMOS transistors 214 and 216 coupled between the output of the NOR gate 112 and the power supply return. The signal input may be coupled to the gates of the PMOS and NMOS transistors 210 and 214, and the enable input may be coupled to the gates of the PMOS and NMOS transistors 212 and 216.

In one embodiment of the CMOS driver 102, the PMOS transistor 212 coupled to the enable input may be eliminated to further reduce the potential for shoot-through current. By inspection, one skilled in the art can readily see that PMOS transistor 212 is only required when its gate drive is low, while at the same time the gate drive to the PMOS transistor 210 is high. Otherwise, the PMOS transistor 212 is not needed. However, as explained in greater detail in connection with FIG. 1, the signal input to the NAND gate 116 is cross-coupled to the enable input through the NOR gate 112 and the first INVERTER 114 in the static condition. Accordingly, on a static basis, there is no way for the gate of the PMOS transistor 210 to be high while the gate of the PMOS transistor 212 is low. And on a dynamic basis, the only time when that will happen is when the signal input to the CMOS driver 102 is making the transition from a low level signal to a high level signal. At that transition, the output of the NAND gate 116 is held high by the PMOS transistor 212 until the high level input signal has propagated through the NOR gate 112 and the first INVERTER 114. Only then will the output of the NAND gate 116 fall to a low level. However, in the absence of the PMOS transistor 212, the output of the NAND gate 116 will not fall simply because the signal input to the CMOS driver 102 has risen to a high level signal. The low level signal on the gate of the NMOS transistor 216 will prevent the NMOS transistor 214 from pulling down the floating output of the NAND gate 116 until the output of the first INVERTER 114 rises to a high level signal. Thus, the PMOS transistor 212 may be omitted, which not only reduces the complexity of the break-before-make circuit 106, but eliminates another potential shoot-through current path through transistors 212, 214 and 216.

Figure 3:
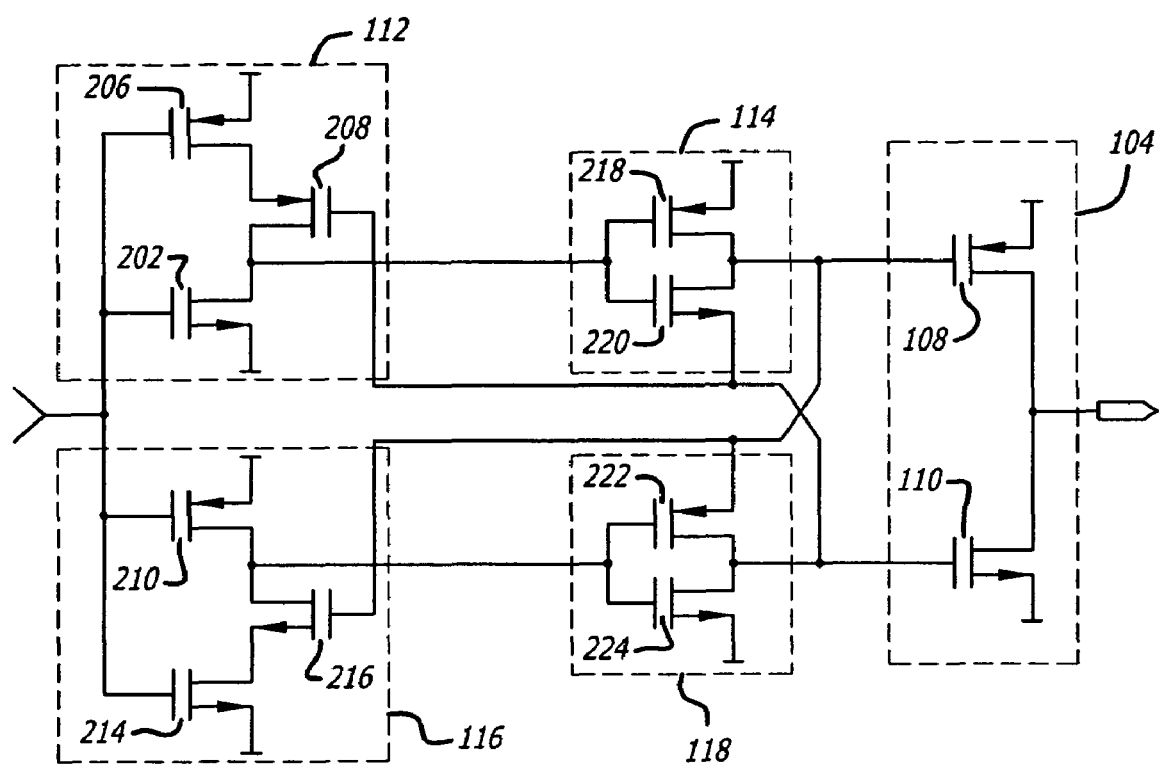
FIG. 3 is a detailed schematic diagram of an alternative embodiment of a CMOS driver.

FIG. 3 is a detailed schematic diagram showing the CMOS driver 102 with the NMOS transistor 204 in the first logic element 112 and the PMOS transistor 212 in the second logic element 116 removed. Although the PMOS transistors 206 and 208 in the first logic element 112 are shown with a specific series connection, those skilled in the art will recognize that the series connection could be reversed. That is, the PMOS transistor 208 could be connected to the power supply and the PMOS transistor 206 could be connected between the PMOS transistor 208 and the NMOS transistor 202. Similarly, the specific series connection of the NMOS transistors 214 and 216 shown in the second logic element 116 could be reversed with the NMOS transistor 216 connected to the power supply return and the NMOS transistor 214 connected between the NMOS transistor 216 and the PMOS transistor 210.

The INVERTERS 114 and 118 may be cross-coupled to create another level of break-before-make protection for the CMOS driver 102. The cross-coupling of the INVERTERS 114 and 118 may be implemented in conjunction with the removal of the NMOS and PMOS transistors 204 and 212 in the break-before-make circuit 106, or alternatively, as a stand-alone change from the traditional inverters.

Turning back to FIG. 2, the first INVERTER 114 may be implemented with a PMOS transistor 218 having its source coupled to the power supply and an NMOS transistor 220 having its source coupled to the power supply return. The drains of the two transistors 218 and 220 may be coupled together and the output taken from the common drain. The gate of each transistor 218 and 220 may also be coupled together with the output of the NOR gate 112. The second INVERTER 118 may be implemented in a similar manner with a PMOS transistor 222 having its source coupled to the power supply and an NMOS transistor 224 having its source coupled to the power supply return. The drains of the two transistors 222 and 224 may be coupled together and the output taken from the common drain. The gate of each transistor 222 and 224 may also be coupled together with the output of the NAND gate 116.

As explained in detail earlier, a high to low transition at the input to the CMOS driver 102 with the NAND gate 116 enabled will cause the output of the second INVERTER 118 to transition from a high to low level. During that transition, the PMOS transistor 208 in the NOR gate 112 may turn ON before the NMOS transistor 110 in the output stage driver 104 turns OFF. If that occurs, the output of NOR gate 112 may be pulled up through the PMOS transistors 206 and 208. This may cause the NMOS transistor 220 in the first INVERTER 114 to start to pull down the gate of the PMOS transistor 108, creating a potential shoot-through current path through the PMOS and NMOS transistors 108 and 110 in the output driver stage 104. The potential for shoot-through current under these conditions may be reduced by coupling the output of the second INVERTER 118 to the source of the NMOS transistor 220 in the first INVERTER 114 as shown in FIG. 3.

Referring back to FIG. 2, a similar situation may occur when the signal input to the CMOS driver 102 transitions from a low level signal to a high level signal with the NOR gate 112 enabled. This signal input transition will cause the output of the first INVERTER 114 to transition from a low to high level signal as well. During that transition, the NMOS transistor 212 in the NAND gate 116 may turn ON before the PMOS transistor 108 in the output stage driver 104 turns OFF. If that occurs, the output of the NAND gate 116 may be pulled down through the NMOS transistors 214 and 216. This may cause the NMOS transistor 222 in the second INVERTER 118 to start to pull up the gate of the NMOS transistor 110, creating a potential shoot-through current path through the PMOS and NMOS transistors 108 and 110 in the output driver stage 104. The potential for shoot-through current under these conditions may be reduced by coupling the output of the first INVERTER 114 to the source of the PMOS transistor 222 in the second INVERTER 114 as shown in FIG. 3.

In addition to providing another level of break-before-make protection, the cross-coupled INVERTERS 114 and 118 may also reduce the potential for shoot-through current in the devices themselves. In FIG. 2, the shoot-through current path for the first INVERTER 114 is through the PMOS and NMOS transistors 218 and 220. However, with the cross-coupled configuration of FIG. 3, the shoot-through current path includes not only the PMOS and NMOS transistors 218 and 220 in the first INVERTER 114, but also the NMOS transistor 224 in the second INVERTER 118. Similarly, the shoot-through current path for the second INVERTER 118 in FIG. 2 is through the PMOS and NMOS transistors 222 and 224. However, with the cross-coupled configuration of FIG. 3, the shoot-through current path includes not only the PMOS and NMOS transistors 222 and 224 in the second INVERTER 118, but in addition the PMOS transistor 218 in the first INVERTER 114.

In an alternative embodiment of the CMOS driver 102 shown in FIG. 2, or in conjunction with the CMOS driver 102 shown in FIG. 3, the two transistors in the INVERTERS 114 and 118 may be implemented with different strengths. This may be done in CMOS by adjusting the dimensions of one or more transistors for a narrower channel width, or a longer channel length, or both. By way of example, the NMOS transistor 224 in the second INVERTER 118 can be made stronger than the PMOS transistor 222 in the same device by increasing the channel width, and/or reducing the channel length of the NMOS transistor 224 in relation to the PMOS transistor 222. Similarly, the PMOS transistor 218 in the first INVERTER 114 can be made much stronger than the NMOS transistor 220 in the same device by increasing the channel width, and/or reducing the channel length of the PMOS transistor 218 in relation to the NMOS transistor 220.

The strength of the each PMOS transistor 218 and 222 determines how quickly it can pull up the gate of its respective transistor 108 or 110 in the output driver stage 104 when it is turned ON. Similarly, the strength of each NMOS transistor 220 and 224 determines how quickly it can pull down the gate of its respective transistor 108 or 110 in the output driver stage 104 when it is turned ON. Thus, by making NMOS transistor 224 in the second INVERTER 118 much stronger than the PMOS transistor 222 in the same device, and making the PMOS transistor 218 in the first INVERTER 114 much stronger than the NMOS transistor 220 in the same device, the two weaker transistors 220 and 222 drive their respective transistors 108 or 110 in the output driver stage 104 ON much slower than the stronger transistors 218 and 224 drive their respective transistors 108 or 110 OFF. This approach may provide yet another break-before-make mechanism. Moreover, the shoot-through current through these transistors in the first and second INVERTERS 114 and 118 may be lower with weaker transistors 220 and 222.

Another potential shoot-through current path may exist through the input transistors 210, 214, and 216 to the break-before-make circuit 106. This may occur if the PMOS and NMOS transistors 210 and 214 are driven rail-to-rail, which may result in both transistors being ON simultaneously during signal input transitions. More specifically, as the signal input transitions from a high level signal to a low level signal, the PMOS transistor 210 may turn ON when the signal input drops slightly (i.e., a small threshold level below the power supply voltage), but the NMOS transistor 214 may not turn OFF until the signal input drops significantly (i.e., a small threshold level above the power supply return). Since the signal applied to the gate of the NMOS transistor 216 will remain high until the low level signal input propagates to the output of the first INVERTER 114, a shoot-through current path may exist through the transistors 210, 214 and 216 during this transition.

Similarly, a potential shoot-through current path may exist through the input transistors 202, 206, and 208 to the break-before-make circuit 106 if the NMOS and PMOS transistors 202 and 206 are driven rail-to-rail. More specifically, as the signal input transitions from a low level signal to a high level signal, the NMOS transistor 202 may turn ON when the signal input rises slightly (i.e., a small threshold level above the power supply return), but the PMOS transistor 206 may not turn OFF until the signal input rises significantly (i.e., a small threshold level below the power supply voltage). Since the signal applied to the gate of the PMOS transistor 208 will remain low until the high level signal input propagates to the output of the second INVERTER 118, a shoot-through current path may exist through the transistors 202, 206 and 208 during this transition.

Figure 4:
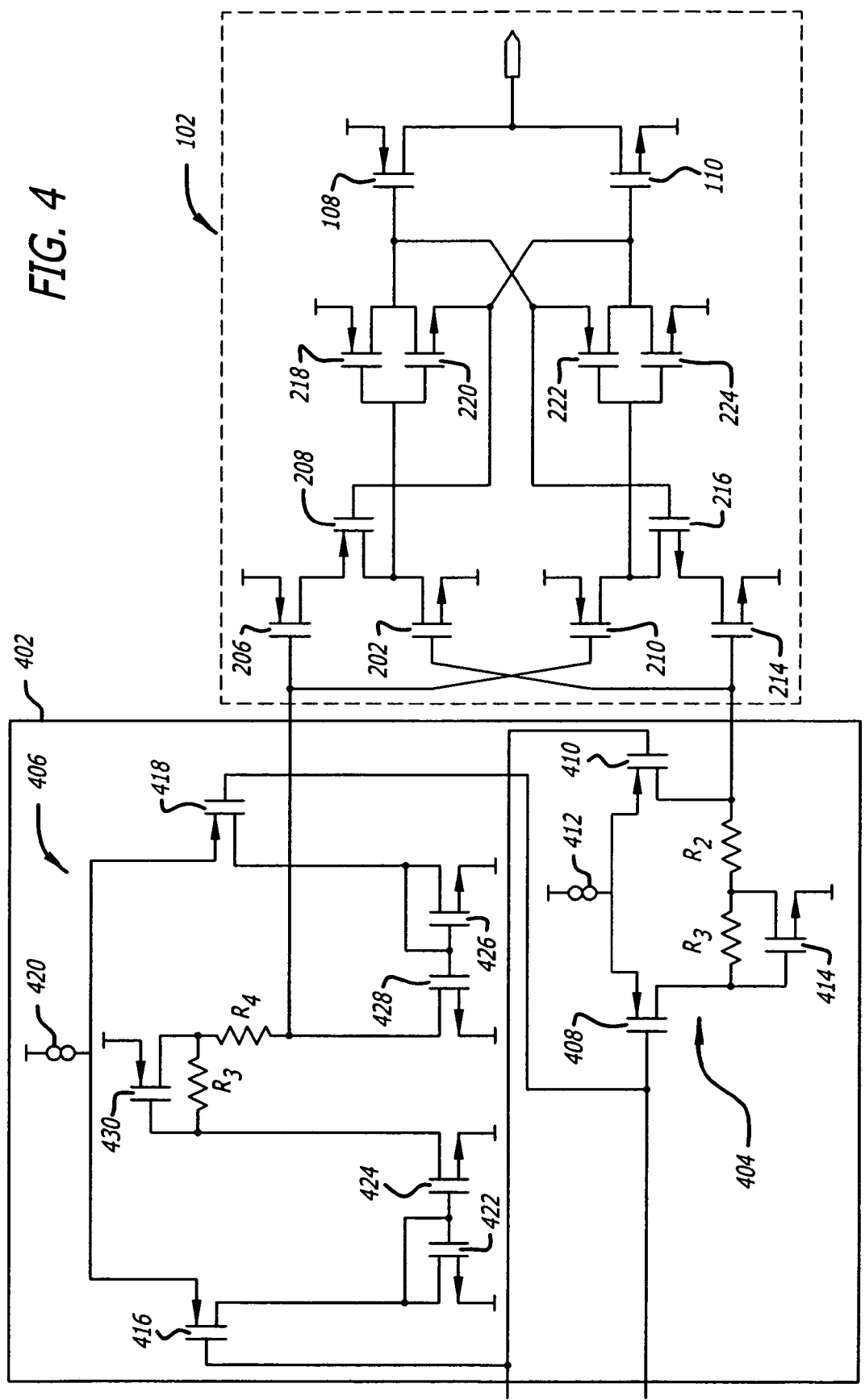
FIG. 4 is a detailed schematic diagram of an output stage for a logic device preceding a CMOS driver.

These potential shoot-through current paths may be reduced or eliminated by separating the signal input to the PMOS transistors 206 and 210 from the signal input to the NMOS transistors 202 and 214, and limiting the voltage swing to each signal input to a controlled amount below the power supply voltage and above the power supply return. This may be achieved in a variety of ways. One example is shown in FIG. 4 where an output stage of a comparator is shown to provide independent drive to the PMOS transistors 206 and 210, and independent drive to the NMOS transistors 202 and 214. Those skilled in the art will readily appreciate that the same or similar output stage design may be implemented in any logic device preceding the CMOS driver. In addition, the skilled artisan will further appreciate that the output stage of the device may limit the voltage swing applied to the CMOS driver 104 in a variety of ways depending on the particular application and the overall design constraints.

Referring to FIG. 4, the output stage 402 may include a NMOS driver circuit 404 and a PMOS driver circuit 406. The NMOS driver circuit 404 may include a differential input comprising first and second PMOS transistors 408 and 410 with their sources coupled to a current source 412. The differential input may be a logic input or a small signal input. The drain of the first PMOS transistor 408 may be coupled to the gate of an NMOS transistor 414 and to the drain of the same NMOS transistor 414 through a first resistor $R_1$. The drain of the second PMOS transistor 410 may also be coupled to the drain of the NMOS transistor 414 through a second resistor $R_2$.

The current source 412 feeding the first and second PMOS transistors 408 and 410 may provide a current that on a DC basis will flow to the power supply return through the NMOS transistor 414. Therefore, except on a transient basis, the gate of the NMOS transistor 414 will remain at the threshold gate-to-source voltage ($V_{GS}$) required for operation. When the differential input to NMOS driver 404 results in a high level signal applied to the gate of the first PMOS transistor 408 and a low level signal applied to the gate of the second PMOS transistor 410, the current will flow from the current source 412 to the power supply return through the second PMOS transistor 410, the second resistor $R_2$, and the NMOS transistor. Except on a transient basis, no current will flow through the first resistor $R_1$. Accordingly, the gate and drain voltages of the NMOS transistor 414 will be essentially the same (i.e., the threshold $V_{GS}$). The gate drive to the NMOS transistors 202 and 214 in the break-before-make circuit 106 will be the threshold $V_{GS}$ plus the voltage drop across the second resistor $R_2$.

Conversely, when the differential input to NMOS driver 404 results in a low level signal applied to the gate of the first PMOS transistor 408 and a high level applied to the gate of the second PMOS transistor 410, the current will flow from the current source 412 to the power supply return through the first PMOS transistor 408, the first resistor $R_1$, and the NMOS transistor 414. Except on a transient basis, no current will flow through the second resistor $R_2$. Accordingly, the gate drive to the NMOS transistors 202 and 214 in the break-before-make circuit 106 will be essentially the same as the drain voltage of the NMOS transistor 414 in the output stage 402 of the comparator. The drain voltage is equal to the threshold $V_{GS}$ minus the voltage drop across the first resistor $R_1$.

The PMOS driver circuit 406 may include a differential input comprising first and second PMOS transistors 416 and 418 with their sources coupled to a current source 420. The drain of the first PMOS transistor 416 may be coupled to a first current mirror comprising NMOS transistors 422 and 424. The drain of the second PMOS transistor 418 may be coupled to a second current mirror comprising NMOS transistors 426 and 428. The NMOS transistor 424 in the first current mirror may be coupled to the gate of PMOS transistor 430, and to the drain of the same PMOS transistor 430 through a third resistor $R_3$. The NMOS transistor 428 in the second current mirror may be coupled to the drain of the PMOS transistor 430 through a fourth resistor $R_4$.

The current source 420 feeding the first and second PMOS transistors 416 and 418 may provide a current that on a DC basis will flow to the power supply return through either the NMOS transistor 422 in the first current mirror or the NMOS transistor 428 in the second current mirror. When the differential input to the PMOS driver 406 results in a high level signal applied to the gate of the first PMOS transistor 416 and a low level signal applied to the gate of the second PMOS transistor 418, the current will flow from the current source 420 to the power supply return through the second PMOS transistor 418 and the NMOS transistor 426. With this differential input, the gates of the NMOS transistors 426 and 428 in the second current mirror will be at the threshold $V_{GS}$ required for operation. As a result, current will flow from the power supply to the power supply return through the PMOS transistor 430, the fourth resistor $R_4$, and the NMOS transistor 428. Since a high level signal is applied to the gate of the PMOS transistor 416, no current will flow through the NMOS transistor 422, and as a result, no current will flow through the third resistor $R_3$ and the NMOS transistor 424. Accordingly, the gate and drain voltages of the PMOS transistor 430 will be essentially the same, which is the required $V_{GS}$ below the power supply necessary for the PMOS transistor 430 to operate. The gate drive to the PMOS transistors 206 and 210 in the break-before-make circuit 106 will be the power supply voltage minus the threshold $V_{GS}$ minus the voltage drop across the fourth resistor $R_4$.

Conversely, when the differential input to the PMOS driver 406 results in a low level signal applied to the gate of the first PMOS transistor 416 and a high level applied to the gate of the second PMOS transistor 418, the current will flow from the current source 420 to the power supply return through the first PMOS transistor 416 and the NMOS transistor 422. With this differential input, the gates of the NMOS transistors 422 and 424 in the first current mirror will be at the threshold $V_{GS}$ required for operation. As a result, current will flow from the power supply to the power supply return through the PMOS transistor 430, the third resistor $R_3$, and the NMOS transistor 424. Since a high level signal is applied to the gate of the PMOS transistor 418, no current will flow through the NMOS transistor 426, and as a result, no current will flow through the fourth resistor $R_4$ and the NMOS transistor 428. Accordingly, the gate drive to the PMOS transistors 206 and 210 in the break-before-make circuit 106 will essentially be the same as the drain voltage of the PMOS transistor 430, which is the power supply voltage minus the threshold $V_{GS}$ plus the voltage drop across the third resistor $R_3$.

In the embodiment described in connection with FIG. 4, each differential input is shown driving one transistor in the NMOS driver circuit 404 and one transistor in the PMOS driving circuit 406 through a common node. However, as those skilled in the art will appreciate, each differential input may be implemented as two physically separate signals.

In one embodiment of the comparator, the first and second resistors $R_1$ and $R_2$ in the NMOS driver 404 may be the same value so the voltage swing applied to the gate of the NMOS transistors 202 and 214 in the break-before-make circuit 206 will be symmetrical about the threshold $V_{GS}$ of the NMOS transistor 414. The voltage swing may be 1 volt centered about the threshold $V_{GS}$ (i.e., 500 mV below the threshold $V_{GS}$ to 500 mV above the threshold $V_{GS}$). This voltage swing may provide ample drive to NMOS transistors 202 and 214 in the break-before-make circuit 106, while improving the comparator speed due to slew-rate limitations.

Similarly, the third and fourth resistors $R_3$ and $R_4$ in the PMOS driver 406 may be the same value so the voltage swing applied to the gate of the PMOS transistors 206 and 210 in the break-before-make circuit 206 will be symmetrical about the threshold $V_{GS}$ below the power supply voltage of the PMOS transistor 430. The voltage swing may also be 1 volt centered about the threshold $V_{GS}$ below the power supply voltage.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit, comprising:
   a CMOS driver including an output stage and break-before-make circuit configured to drive the output stage, the break-before-make circuit having a first logic element, and a second logic element cross-coupled to the first logic element; and
   a logic circuit configured to provide a first input signal having first and second logic states to a first input in each of the first and second logic elements, and provide a second input signal having first and second logic states to a second input in each of the first and second logic elements, the first logic state of the first input signal having a voltage higher than the voltage of the first logic state of the second input signal, and the second logic state of the first input signal having a voltage higher than the voltage of the second logic state of the second input signal.

2. The circuit of claim 1 wherein the logic circuit comprises a comparator.

3. The circuit of claim 1 wherein the first input of each of the first and second logic elements comprises a PMOS transistor and the second input of each of the first and second logic elements comprises a NMOS.

4. The circuit of claim 3 wherein the logic circuit comprises a NMOS driving circuit including a NMOS transistor having a source configured to be coupled to a power supply return and a drain coupled through a first resistor to a first current source and the NMOS transistors in the break-before-make circuit, the NMOS transistor in the logic circuit further having a gate coupled through a second resistor to its drain, and wherein the logic circuit further comprises a PMOS driving circuit including a PMOS transistor having a source configured to be coupled to a power supply and a drain coupled through a third resistor to a second current source and the PMOS transistors in the break-before-make circuit, the PMOS transistor in the logic circuit further having a gate coupled through a fourth resistor to its drain.

5. The circuit of claim 3 wherein the logic circuit comprises a PMOS driving circuit configured to provide the first input signal to the break-before-make circuit, the PMOS driving circuit comprising a PMOS transistor configured to be coupled to a power supply, and wherein the voltage range between the first and second logic states of the first input signal is centered at a voltage equal to the minimum voltage required to turn off the PMOS transistor in the logic circuit, and wherein the logic circuit further comprises a NMOS driving circuit configured to provide the second input signal to the break-before-make circuit, the NMOS driving circuit comprising a NMOS transistor configured to be coupled to a power supply return, and wherein the voltage range between the first and second logic states of the second input signal is centered at a voltage equal to the minimum voltage to turn on the NMOS transistor in the logic circuit.

6. The circuit of claim 3 wherein each of the first and second logic elements has an enabled state and a disabled state, and wherein the first and second input signals provided by the logic circuit to the first and second logic elements are responsive to a signal input to the logic circuit, each of the first and second logic elements being configured to invert the signal input to the logic circuit in the enabled state, and float its respective output in the disabled state.

7. The circuit of claim 6 wherein the break-before-make circuit further comprises a first inverter having an input coupled to the output of the first logic element, and a second inverter having an input coupled to the output of the second logic element, the first inverter being configured for a connection to a power supply return through the second inverter, and the second inverter being configured for a connection to a power supply through the first inverter.

8. The circuit of claim 3 wherein each of the first and second logic elements has an enabled state and a disabled state, and wherein the first and second input signals provided by the logic circuit to the first and second logic elements are responsive to a signal input to the logic circuit, each of the first and second logic elements being configured to invert the signal input to the logic circuit in the enabled state, and wherein the break-before-make circuit further comprises a first inverter having an input coupled to the output of the first logic element, and a second inverter having an input coupled to the output of the second logic element, the first inverter being configured for a connection to a power supply return through the output of the second inverter, and the second inverter being configured for a connection to a power supply through the output of the first inverter.

9. The circuit of claim 8 wherein each of the first and second logic elements is further configured to float its respective output in the disabled state.

* * * * *